(12) United States Patent
Ha et al.

(10) Patent No.: US 10,868,104 B2
(45) Date of Patent: Dec. 15, 2020

(54) TILING DISPLAY DEVICE

(71) Applicant: LG Display Co., Ltd., Seoul (KR)

(72) Inventors: Jungwoo Ha, Paju-si (KR); Joonsoo Han, Paju-si (KR); Hyunjae Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/541,649

(22) Filed: Aug. 15, 2019

(65) Prior Publication Data
US 2020/0058730 A1     Feb. 20, 2020

(30) Foreign Application Priority Data
Aug. 17, 2018    (KR) .................... 10-2018-0096217

(51) Int. Cl.
    *H01L 27/32*      (2006.01)
    *H05K 5/00*      (2006.01)
    *H05K 1/14*      (2006.01)
    *H05K 5/02*      (2006.01)

(52) U.S. Cl.
CPC ......... *H01L 27/3293* (2013.01); *H05K 1/147* (2013.01); *H05K 5/0017* (2013.01); *H05K 5/0021* (2013.01); *H05K 5/0204* (2013.01); *H05K 2201/10128* (2013.01)

(58) Field of Classification Search
CPC .. H01L 27/3293; H05K 1/147; H05K 5/0017; H05K 5/0021; H05K 5/0204; H05K 2201/10128; H05K 1/147
See application file for complete search history.

(56) References Cited

U.S. PATENT DOCUMENTS

2016/0014882 A1*   1/2016   Jongman ............. G02F 1/13452
                                                                       361/749

FOREIGN PATENT DOCUMENTS

KR     10-2015-0006331 A     1/2015
KR     10-2016-0131955 A    11/2016

* cited by examiner

*Primary Examiner* — James Wu
*Assistant Examiner* — Hung Q Dang
(74) *Attorney, Agent, or Firm* — Morgan, Lewis & Bockius LLP (57) ABSTRACT

A tiling display device includes a plurality of display panel modules, each including: a display panel including a display area and a non-display area; a form support member bonded to the bottom surface of the display panel and supporting the form of the display panel; a fixing member attached to the bottom surface of the form support member; and a case top placed around the fixing member, for attaching to the fixing member, wherein at least one side of each display panel module overlaps a neighboring display panel module, and the surfaces of the display panel modules lie in the same line.

9 Claims, 10 Drawing Sheets

TILING DISPLAY DEVICE

This application claims the priority benefit of Korean Patent Application No. 10-2018-0096217 filed on Aug. 17, 2018, which is incorporated herein by reference for all purposes as if fully set forth herein.

BACKGROUND

Technical Field

The present invention relates to a tiling display device.

Discussion of the Related Art

With the development of the information society, various demands for display devices for displaying images are on the rise. In the field of display devices, flat panel display devices (FPDs), which are thin and light and can cover a large area, have been rapidly replacing cathode ray tubes (CRTs), which are bulky. The flat panel display devices include liquid-crystal displays (LCDs), plasma display panels (PDPs), organic light-emitting displays (OLEDs), electrophoretic display devices (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible substrate, and have advantages over plasma display panels or inorganic electroluminescence (EL) displays in that they can operate at a low voltage, have lower power consumption, and deliver vivid color reproduction.

A plurality of organic light-emitting displays may be joined together and used as a tiling display device which comes in a super-large size.

Figure 1:
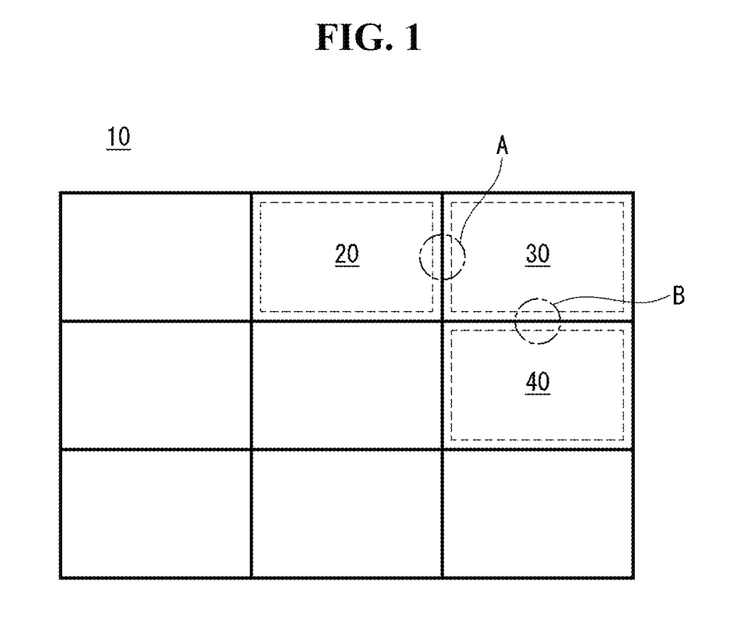
FIG. 1 is a plan view showing a conventional tiling display device.
Figure 2A:
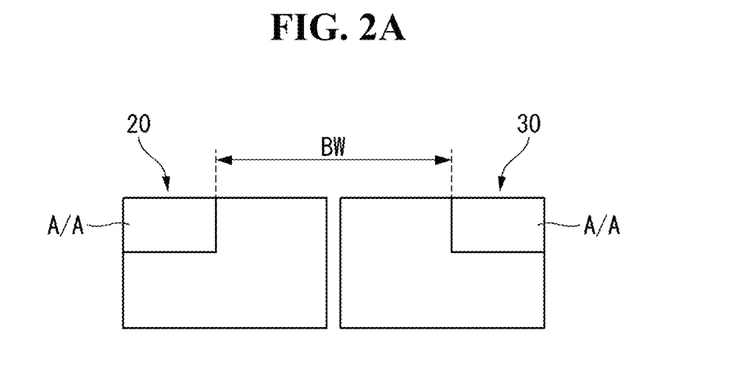
FIG. 2A is a cross-sectional view showing area A in FIG. 1.

FIG. 1 is a plan view showing a related art tiling display device. FIG. 2A is a cross-sectional view showing area A in FIG. 1, and FIG. 2B is a cross-sectional view showing area B in FIG. 1.

Referring to FIG. 1, a tiling display device 10 may comprise a plurality of display panel modules 20, 30, and 40. For example, nine display panel modules in a 3×3 arrangement may make up a single tiling display device 10, as shown in FIG. 1. However, in a case where a plurality of display panel modules lie in the same plane, there will be boundary portions in sight where no images are displayed, due to the bezels of the display panel modules. Accordingly, the tiling display device 10 is configured in such a way that some of the display panel modules overlap, in order to minimize the boundary portions between the display panel modules where no images are displayed.

Figure 2B:
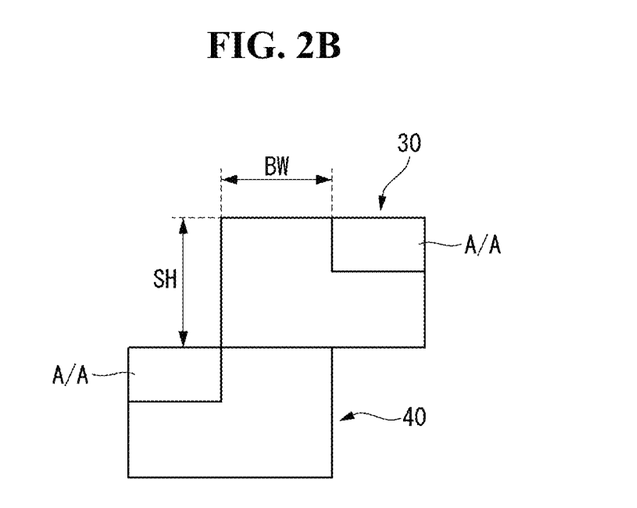
FIG. 2B is a cross-sectional view of area B in FIG. 1.

As shown in FIGS. 2A and 2B, the display panel modules 20, 30, and 40 each have a display area A/A where images are displayed. Among them, the display panel modules 20 and 30 on the left and right sides lie in the same plane, and have a boundary portion BW where no images are displayed, due to the bezels of the display panel modules 20 and 30. The display panel modules 30 and 40 on the upper and lower sides overlap each other, thus creating a vertical height difference SH, as well as the boundary portion BW.

Therefore, display quality may degrade due to the boundary portion BW and vertical height difference SH on the display panel modules.

SUMMARY

Accordingly, embodiments of the present disclosure are directed to a display device that substantially obviates one or more of the problems due to limitations and disadvantages of the related art.

An aspect of the present disclosure is to provide a tiling display device capable of improving display quality by minimizing boundary portions between display panel modules and removing vertical height differences.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a tiling display device comprises a plurality of display panel modules, each comprising: a display panel comprising a display area and a non-display area; a form support member bonded to a bottom surface of the display panel and supporting the form of the display panel; a fixing member combined to a bottom surface of the form support member; and a case top be coupled to the fixing memberat a side surface of the fixing member, wherein the plurality of display panel modules is mounted on a cabinet, wherein at least one side of each display panel module overlaps a neighboring display panel module, and the surfaces of the display panel modules lie in the same line.

In an aspect, the non-display area of the display panel comprises bending portions, and the bending portions are formed on at least two sides of the non-display area to which a printed circuit board is connected.

In an aspect, the form support member comprises a stepped portion that is small in thickness, and the stepped portion is placed adjacent to the bending portion, with the display area of the display panel placed in therebetween.

In an aspect, a bending portion of one of two neighboring display panel modules and a stepped portion of the other display panel module overlap each other.

In an aspect, the tiling display device further comprises a cushioning member located between the bending portion and the stepped portion, and further comprises a resin that fills gaps between at least two display panel modules whose the bending portion and the stepped portion overlap each other.

In an aspect, among all the sides of the non-display area of the display panel, the sides to which a printed circuit board is connected are larger in width than the sides adjacent to each other with the display area placed in therebetween.

In an aspect, in the display panel, the bending portions are separated from each other in an area where the bending portions are adjacent to each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Hereinafter, exemplary embodiments of the present disclosure will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention. The names of the elements used in the following description may be selected for ease of writing the specification, and may be different from the names of parts in actual products.

A display panel according to the present invention is a display panel in which display elements are formed on a flexible substrate. Although examples of the display panel include an organic light-emitting display, a liquid-crystal display, and an electrophoretic display, etc., the present invention will be described with respect to an organic light-emitting display. The organic light-emitting display comprises an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the display device to emit light itself.

Figure 3:
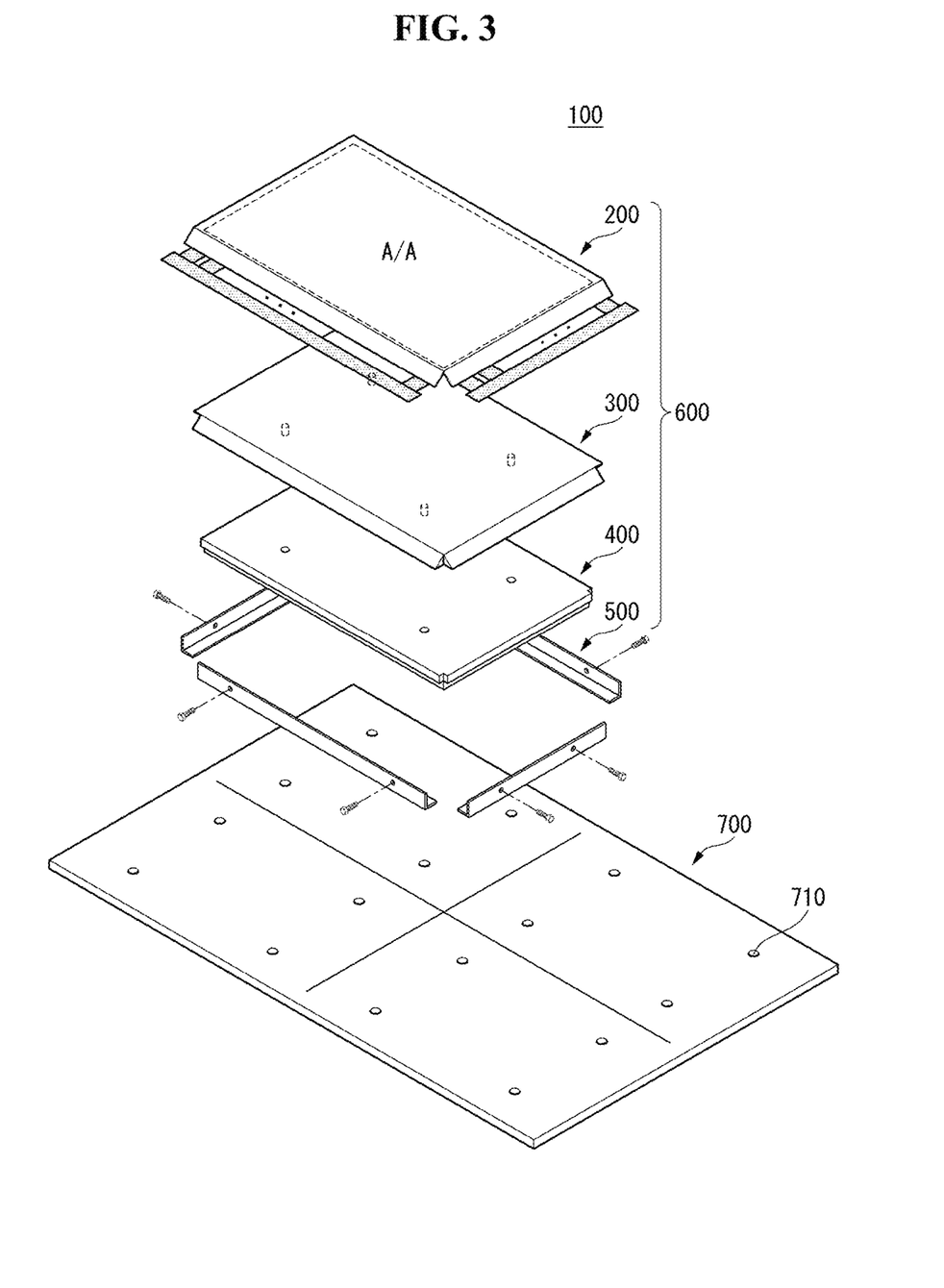
FIG. 3 is a perspective view showing a tiling display device according to an exemplary embodiment of the present invention.

FIG. 3 is a perspective view showing a tiling display device according to an exemplary embodiment of the present invention.

Referring to FIG. 3, a tiling display device 100 according to an exemplary embodiment of the present invention comprises a display panel module 600 comprising a display panel 200, a form support member 300 bonded to the bottom surface of the display panel 200, a fixing member 400 that fixes the form support member 300 to itself from under the form support member 300, and a case top 500 fastened to the fixing member 400. A plurality of display panel modules 600 are mounted on a cabinet 700 to form the tiling display device 100.

The display panel 200 comprises a display area A/A that displays an image and a non-display area (not shown) outside the display area A/A. The display panel 200 of the present invention may be a flexible display panel 200 with a printed circuit board in which the non-display area bends on at least two sides. The form support member 300 is bonded to the display panel 200 to support the form of the display panel 200 so that the flexible structure of the display panel 200 maintains a given form. The fixing member 400 secures the form support member 300 bonded to the display panel 200 to itself so that the display panel module 600 is attached onto the cabinet 700. The case top 500 is for containing the display panel 200, the form support member 300, and the fixing member 400. The cabinet 700 serves as a support substrate where the display panel modules 600 comprising the display panel 200, form support member 300, fixing member 400, and case top 500 are held together to form a tiling display device.

The components of the tiling display device 100 thus constructed according to an exemplary embodiment of the present invention will be described in more details below.

Figure 4:
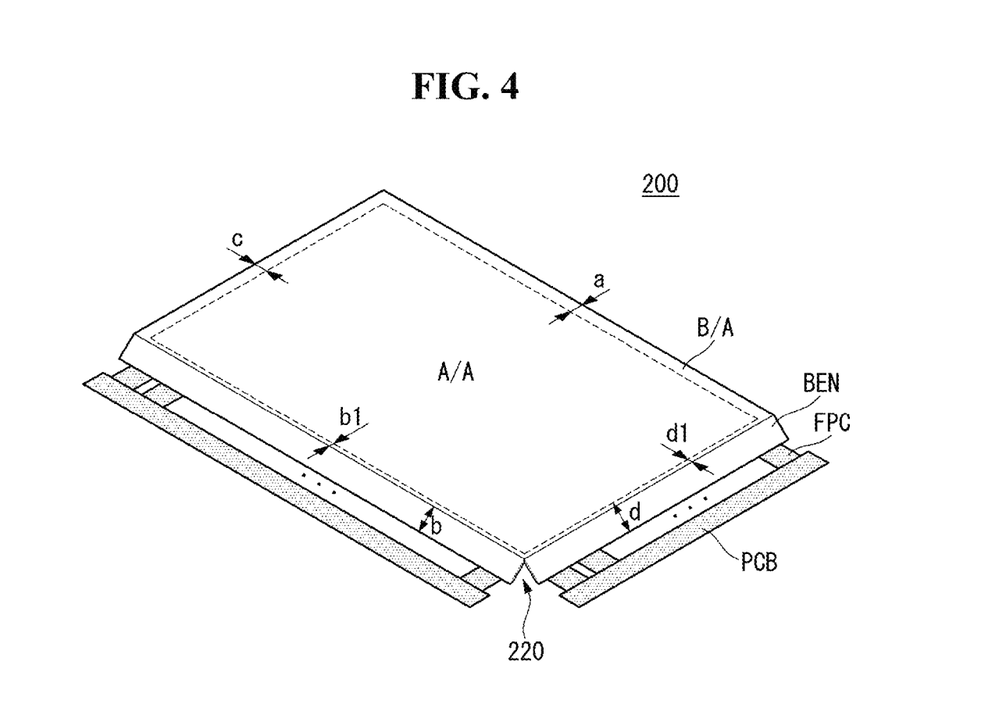
FIG. 4 is a perspective view showing a display panel according to an exemplary embodiment of the present invention.
Figure 5:
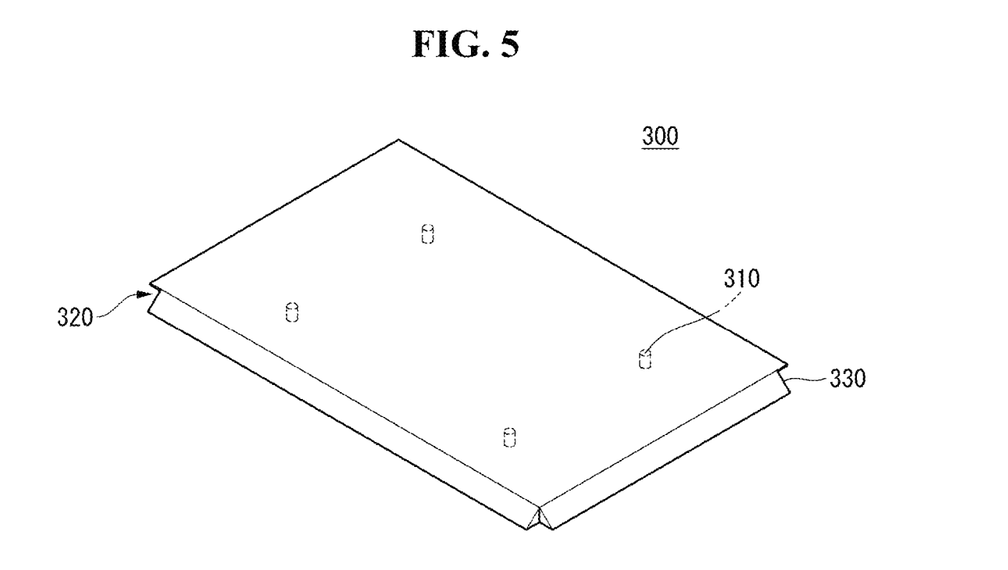
FIG. 5 is a perspective view showing a form support member according to an exemplary embodiment of the present invention.
Figure 6:
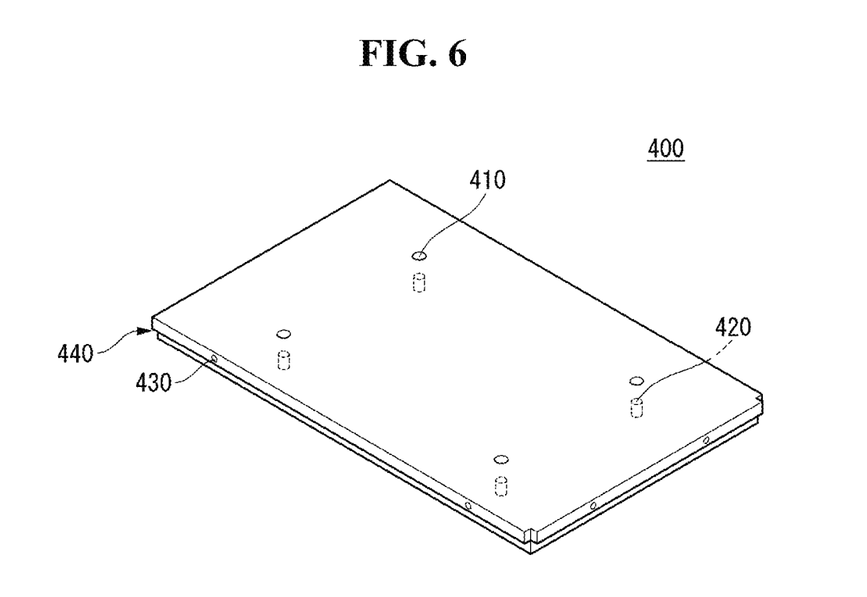
FIG. 6 is a perspective view showing a fixing member according to an exemplary embodiment of the present invention.
Figure 7:
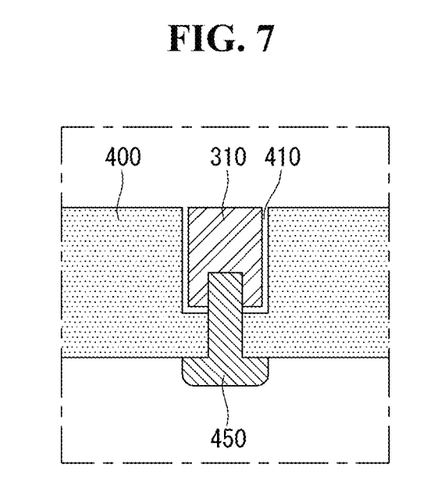
FIG. 7 is a cross-sectional view showing a structure for holding together the form support member and the fixing member according to an exemplary embodiment of the present invention.
Figure 8:
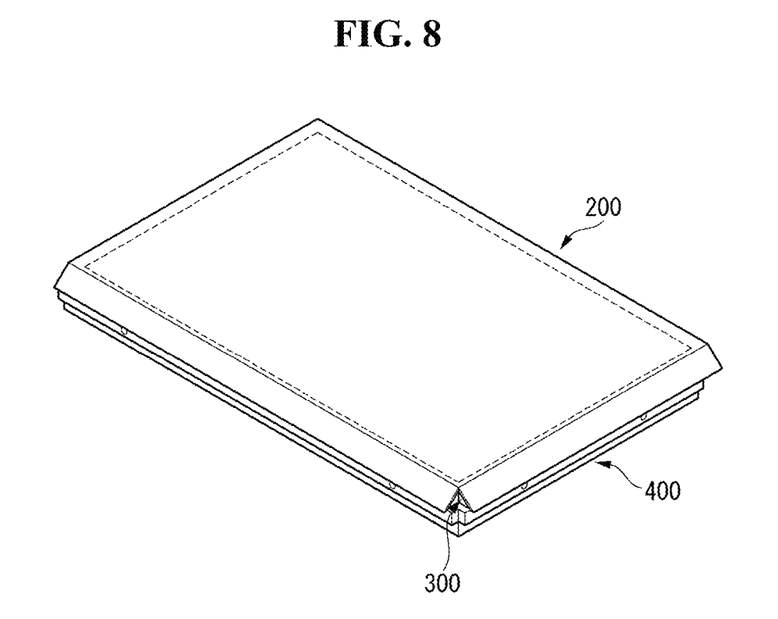
FIG. 8 is a perspective view showing the display panel, form support member, and fixing member held together according to an exemplary embodiment of the present invention.
Figure 9:
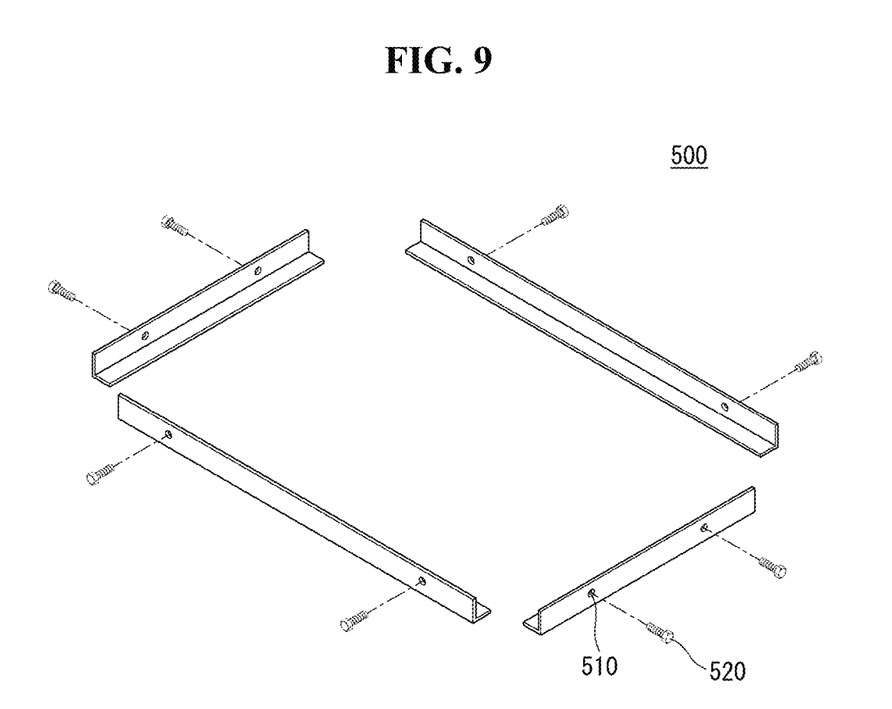
FIG. 9 is a perspective view showing a case top according to an exemplary embodiment of the present invention.
Figure 10:
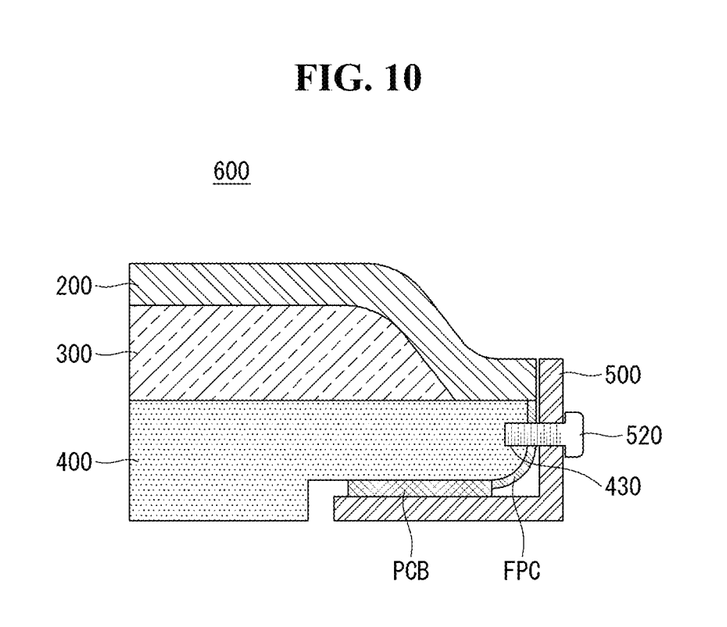
FIG. 10 is a cross-sectional view showing a display panel module according to an exemplary embodiment of the present invention.

FIG. 4 is a perspective view showing a display panel according to an exemplary embodiment of the present invention. FIG. 5 is a perspective view showing a form support member according to an exemplary embodiment of the present invention. FIG. 6 is a perspective view showing a fixing member according to an exemplary embodiment of the present invention. FIG. 7 is a cross-sectional view showing a structure for holding together the form support member and the fixing member according to an exemplary embodiment of the present invention. FIG. 8 is a perspective view showing the display panel, form support member, and fixing member held together according to an exemplary embodiment of the present invention. FIG. 9 is a perspective view showing a case top according to an exemplary embodiment of the present invention. FIG. 10 is a cross-sectional view showing a display panel module according to an exemplary embodiment of the present invention.

Referring to FIG. 4, the display panel 200 comprises a display area A/A that displays an image and a non-display area B/A outside the display area A/A. The display area A/A comprises a plurality of sub-pixels which work to display an image. The sub-pixels comprise red sub-pixels, green sub-pixels, and blue sub-pixels, or comprise white sub-pixels, red sub-pixels, green sub-pixels, and blue sub-pixels. The sub-pixels may have one or more different emission areas depending on their emission characteristics. Each sub-pixel comprises a switching transistor, a driving transistor, a capacitor, and an organic light emitting diode. In response to a scan signal supplied through a gate line, the switching transistor performs a switching operation so that a data signal supplied through the data line is stored as a data voltage in the capacitor. The driving transistor operates in such a way that a driving current flows between a power supply line (high-level voltage) and a cathode power supply line (low-level voltage) in response to the data voltage stored in the capacitor. The organic light-emitting diode operates in such a way as to emit light by the driving current formed by the driving transistor. The non-display area B/A comprises a data driver that applies a data signal to the sub-pixels and a scan driver that applies a scan signal to the sub-pixels.

In the display panel 200, a printed circuit board PCB is connected to at least two sides of the non-display area B/A through a flexible printed circuit FPC. The display panel 200 of the present invention may be a flexible display panel 200 with a printed circuit board in which the non-display area B/A bends on at least two sides.

In the display panel 200 according to an exemplary embodiment of the present invention, the non-display area B/A may be asymmetrical in width. More specifically, the non-display area B/A of the display panel 200 comprises a first side (a) which is one of the long sides, a second side (b) which faces the first side (a), a third side (c) which is one of the short sides, and a fourth side (d) which faces the third side (c). The second side (b) and the fourth side (d) may be sides to which the printed circuit board PCB is connected. The second side (b) is larger in width than the first side (a) because a pad portion for connecting to the printed circuit board PCB is located on the second side (b). The fourth side (d) also is larger in width than the third side (c) because a pad portion is located on the fourth side (d). That is, among all the sides of the non-display area B/A of the display panel 200, the sides to which the printed circuit board PCB are attached may be larger in width than the sides adjacent to each other with the display area A/A placed in between.

The second side (b) and fourth side (d) of the non-display area B/A each comprise a bending portion BEN. The bending portion BEN is a portion which a neighboring display panel 200 overlaps, which can be formed by the flexibility of the flexible display panel. A more detailed description will be given later.

The second side (b) comprise a (2−1)th side (b1) visible to the user, besides the bending portion BEN, and the fourth side (d) also comprises a (4−1)th side (d1). In this case, the (2−1)th side (b1), which is adjacent to another display panel 200, is smaller in width than the first side (a), and the (4−1)th side (d1) is smaller in width than the third side (c). Therefore, the boundary portion between neighboring display panels 200 can be minimized, thereby improving the display quality visible to the user.

The display panel 200 has a separation portion 220 where the second side (b) and the fourth side (d) are not connected together, so that bending portions BEN are respectively formed on the second side (b) and the fourth side (d). That is, the display panel 200 comprises a separation portion 220 where the bending portions BEN are adjacent to each other and separated from each other. The separation portion 220 is an area formed by cutting the connecting part the second side (b) and fourth side (d) by laser cutting or the like. Conventionally, there are LOG areas where LOG wires are arranged, due to the separation portion 220, whereas, in the present invention, the separation portion 220 can be formed by placing the GIP driver within the display area A/A so that the LOG wires are placed within the display area A/A.

In the display panel 200 according to an exemplary embodiment of the present invention, the bending portions BEN are formed on at least two sides of the non-display area B/A to which the printed circuit board PCB is connected, and the form support member 300 is bonded to the bottom surface to maintain the form of the bending portion BEN.

Referring to FIG. 5, the form support member 300 is bonded to the display panel 200 to support the form of the display panel 200 so that the flexible structure of the display panel 200 maintains a given form. To this end, at least two sides of the form support member 300 have a sloping surface 330. That is, two sides of the form support member 300 corresponding to the second side (b) and fourth side (d) of the display panel 200 have a sloping surface 330. Accordingly, the display panel 200 to be bonded to the form support member 300 may maintain its form as the second side (b) and the fourth side (d) are bonded along the sloping surfaces 330 of the form support member 300.

A plurality of first projections 310 are formed on the bottom surface of the form support member 300, which project downward so as to be combined to the fixing member 400. Moreover, a first stepped portion 320 is formed on the other two sides other than the two sides with a curved cross-section, which is small in thickness. The first stepped portion 320 is an area which a bending portion BEN of a neighboring display panel overlaps. The first stepped portion 320 is placed adjacent to the bending portions BEN, with the display area A/A of the display panel 200 placed in between.

The form support member 300 to which the display panel 200 is bonded is secured to the fixing member 400.

Referring to FIG. 6, the fixing member 400 secures the form support member 300 bonded to the display panel 200 to itself so that the display panel module 600 is combined onto the cabinet 700. First recesses 410 are formed on the top surface of the fixing member 400 so that the first projections 310 of the form support member 300 are inserted through them. Second projections 420 are formed on the bottom surface so as to be combined to the cabinet 700. Moreover, second recesses 430 are formed on each side of the fixing member 400 so as to be combined to the case top 500. Further, the fixing member 400 has a second stepped portion 440, which is small in thickness, in order to create a space for allowing for easy attachment of the fixing member 400 to the case top 500.

Referring to FIG. 7, the form support member 300 and the fixing member 400 are held together with bolts 450. That is, the first projections 310 of the form support member 300 are inserted into the first recesses 410 of the fixing member 400 and the bolts 450 penetrating the bottom surface of the fixing member 400 are inserted into the first projections 310 of the form support member 300, whereby the form support member 300 and the fixing member 400 are held together. Accordingly, as shown in FIG. 8, the display panel 200, the form support member 300, and the fixing member 400 are held together.

The display panel 200, the form support member 300, and the fixing member held together are contained in the case top 500.

Referring to FIG. 9, the case top 500 serves to contain the display panel 200, the form support member 300, and the fixing member 400. The case top 500 may have a 'L'-shaped cross-section structure so that the top and bottom are open and the sides cover the display panel 200, the form support member 300, and the fixing member 400. A plurality of first holes 510 are formed on each side of the case top 500 so as to be combined to the fixing member 400, and are combined to the fixing member 400 with bolts 520.

The display panel 200, the form support member 300, and the fixing member 400 held together are contained in the case top 500 to form a display panel module 600.

Referring to FIG. 10, the display panel 200 is bonded to the form support member 300, and the form support member 300 is secured to the fixing member 400, all of which are integrated into the display panel module 600. The flexible printed circuit FPC and printed circuit board PCB of the display panel 200 are curved down the fixing member 400.

The case top 500 covers the sides of the fixing member 400, and bolts 520 are passed through the first holes 510 of the case top 500 and fastened to the second recesses 430 of the fixing member 400, whereby the display panel 200, the form support member 300, and the fixing member 400 are contained in the case top 500. As such, the display panel module 600 according to an exemplary embodiment of the present invention is configured.

Below is a description of the above-described display panel module 600 which is combined to the cabinet 700 and forms a tiling display device.

Figure 11:
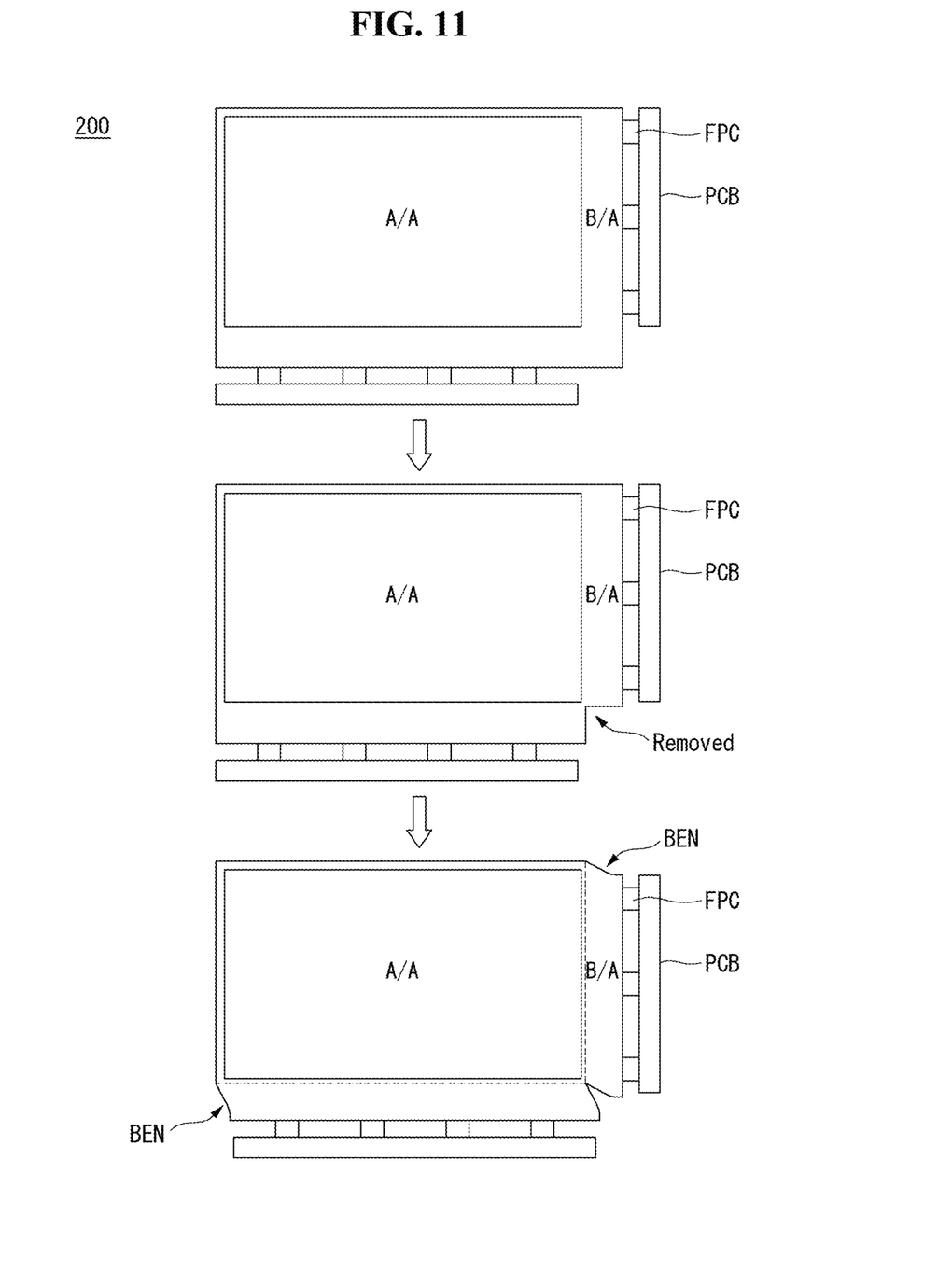
FIG. 11 is a view showing each process of a method of manufacturing a display panel according to an exemplary embodiment of the present invention.
Figure 12:
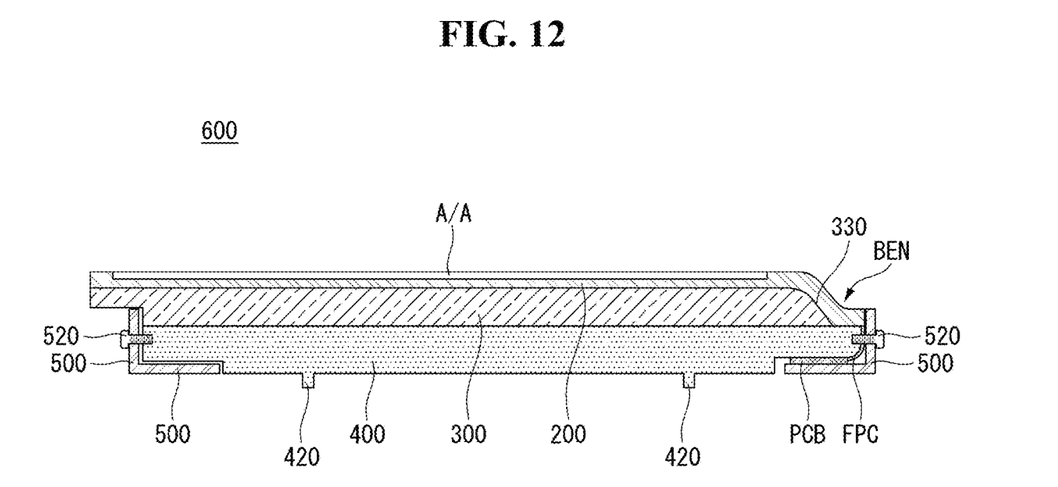
FIG. 12 is a cross-sectional view showing a display panel module according to an exemplary embodiment of the present invention.
Figure 13:
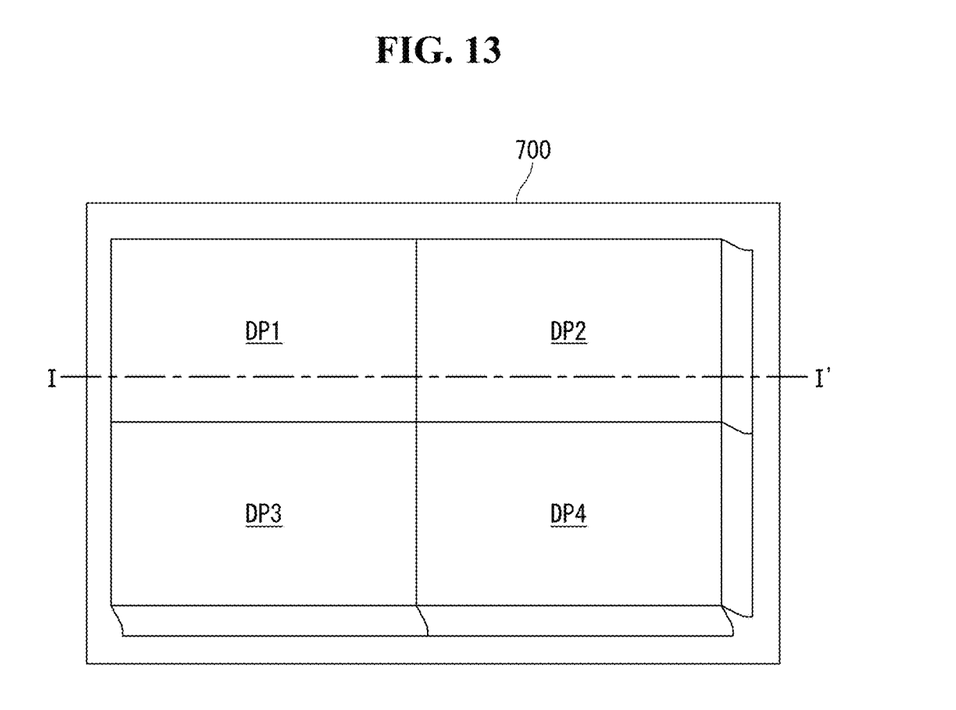
FIG. 13 is a plan view of a plurality of display panel modules mounted to a cabinet.
Figure 14:
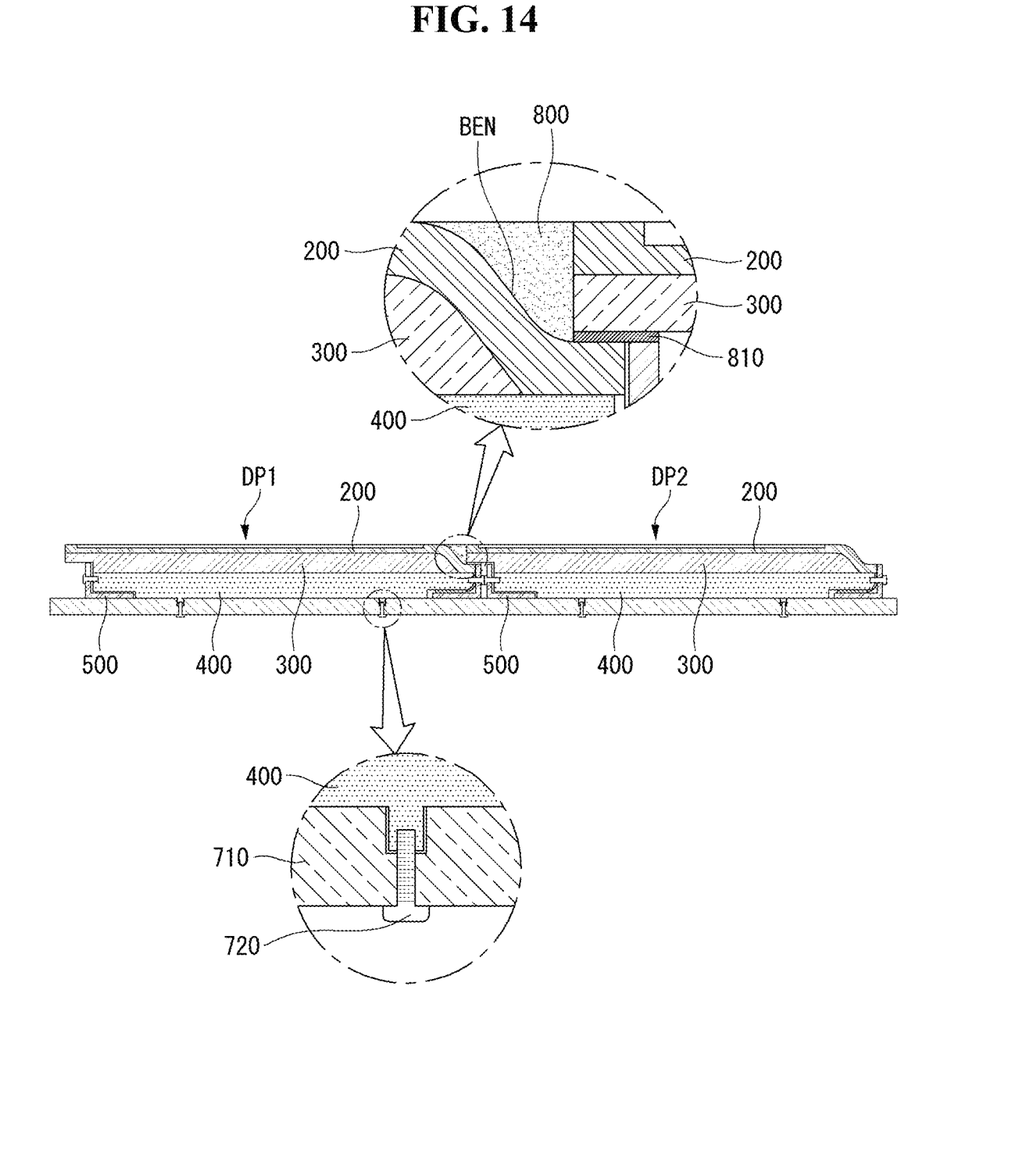
FIG. 14 is a view showing a cross-section taken along the line I-I' in FIG. 13.

FIG. 11 is a view showing each process of a method of manufacturing a display panel according to an exemplary embodiment of the present invention. FIG. 12 is a cross-sectional view showing a display panel module according to an exemplary embodiment of the present invention. FIG. 13 is a plan view of a plurality of display panel modules mounted to a cabinet. FIG. 14 is a view showing a cross-section taken along the line I-I' in FIG. 13.

Referring to FIG. 11, a display panel 200 with a display area A/A and a non-display area B/A is fabricated, and a flexible printed circuit FPC with a printed circuit board PCB attached to it is attached to pad portions on two sides of the non-display area B/A of the display panel 200. Next, the corner connecting the two sides of the non-display area B/A with the flexible printed circuit FPC attached to it is removed by cutting it out by laser. Subsequently, the two sides of the non-display area B/A with the flexible printed circuit FPC attached to it bend to form bending portions BEN.

Referring to FIG. 12, the form support member 300 is bonded with adhesive to the bottom surface of the fabricated display panel 200. Since the form support member 300 has sloping surfaces 330 in the areas corresponding to the bending portions BEN of the display panel 200, the bending portions BEN of the display panel 200 is partially bonded to the sloping surfaces 330 of the form support member 300, thereby maintaining its form.

The fixing member 400 is attached to the bottom surface of the form support member 300, and the fixing member 400 is attached to the case top 500. The printed circuit board PCB and flexible printed circuit FPC of the display panel 200 are curved down the fixing member 400. Accordingly, the display panel 200, the form support member 300, the fixing member 400, and the case top 500 are held together to form a display panel module 600.

Referring to FIG. 13, a plurality of display panel modules are combined one by one onto the cabinet 700. For example, a description will be given of a structure in which a first display panel module DP1, a second display panel module DP2, a third display panel module DP3, and a fourth display panel module DP4 are combined onto the cabinet 700.

Referring to FIG. 14, the first display panel module DP1 is placed on the cabinet 700 and fastened with bolts 720 to the second projections 420 of the fixing member 400 via second holes 710 formed in the cabinet 700. Like the first display panel module DP1, the second display panel module DP2 is fastened to the cabinet 700.

Here, a bending portion of one of two neighboring display panel modules and a stepped portion of the other display panel module are configured to overlap each other. For example, a stepped portion 320 formed on the form support member 300 of the second display panel module DP2 overlaps a bending portion BEN of the first display panel module DP1, so that the surfaces of the first display panel module DP1 and second display panel module DP3 lie in the same line. Likewise, the third display panel module DP3 is combined to the bottom surface of the first display panel module DP1. As explained just above, a stepped portion formed on the form support member of the third display panel module DP3 overlaps a bending portion of the first display panel module DP1. The fourth display panel module DP4 is combined to the bottom surface of the second display panel module DP2. Stepped portions formed on the form support member of the fourth display panel module DP4 overlap a bending portion of the second display panel module DP2 and a bending portion of the third display panel module DP3, respectively.

The first to fourth display panel modules DP1 to DP4 have gaps in between even if they overlap one another. These gaps are filled with a transparent or opaque resin 800 to prevent the gaps from being visible. Moreover, a cushioning member 810 for preventing shocks may be provided in the overlapping regions of the first to fourth display panel modules DP1 to DP4,—for example, between a bending portion BEN of the first display panel module DP1 and a stepped portion 320 of the second display panel module DP2. The cushioning member 810 may be any flexible material such as rubber.

As seen from above, a tiling display device according to an exemplary embodiment of the present invention offers the advantages of minimizing boundary portions between display panel modules and eliminating vertical height differences, by using a flexible display panel in which part of the non-display area bends and overlaps a neighboring display panel.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A tiling display device comprising a plurality of display panel modules, each comprising:
 a display panel comprising a display area having a plurality of sub-pixels and a non-display area having a data driver that applies data signals to the plurality of sub-pixels and a scan driver that applies scan signals to the plurality of sub-pixels;
 a form support member bonded to a bottom surface of the display panel and supporting the form of the display panel, the form support member including one side having a stepped portion and another side having a sloping surface;
 a fixing member combined to a bottom surface of the form support member; and
 a case top coupled to the fixing member at a side surface of the fixing member,
 wherein the plurality of display panel modules is mounted on a cabinet,
 wherein at least one side of each display panel module overlaps a neighboring display panel module, and the surfaces of the display panel modules lie in the same line.

2. The tiling display device of claim 1, wherein the non-display area of the display panel comprises bending portions.

3. The tiling display device of claim 2, wherein the bending portions are formed on at least two sides of the non-display area to which a printed circuit board is connected.

4. The tiling display device of claim 1, wherein the stepped portion is placed adjacent to the bending portion, with the display area of the display panel placed in therebetween.

5. The tiling display device of claim 1, wherein a bending portion of one of two neighboring display panel modules and a stepped portion of the other display panel module overlap each other.

6. The tiling display device of claim 5, further comprising a cushioning member located between the bending portion and the stepped portion.

7. The tiling display device of claim 5, further comprising a resin that fills gaps between at least two display panel modules whose the bending portion and the stepped portion overlap each other.

8. The tiling display device of claim 1, wherein, among all the sides of the non-display area of the display panel, the sides to which a printed circuit board is connected are larger in width than the sides adjacent to each other with the display area placed in therebetween.

9. The tiling display device of claim 3, wherein, in the display panel, the bending portions are separated from each other by a separation portion in an area where the bending portions are adjacent to each other.

* * * * *